US010483905B2

(12) United States Patent
Vance

(10) Patent No.: US 10,483,905 B2
(45) Date of Patent: Nov. 19, 2019

(54) IMAGE PRODUCING NANOSTRUCTURE SURFACE

(71) Applicant: Dan Vance, San Diego, CA (US)

(72) Inventor: Dan Vance, San Diego, CA (US)

( * ) Notice: Subject to any disclaimer, the term of this patent is extended or adjusted under 35 U.S.C. 154(b) by 416 days.

(21) Appl. No.: 15/181,515

(22) Filed: Jun. 14, 2016

(65) Prior Publication Data

US 2016/0365832 A1 Dec. 15, 2016

Related U.S. Application Data

(60) Provisional application No. 62/230,774, filed on Jun. 15, 2015.

(51) Int. Cl.
*B05D 3/00* (2006.01)
*H02S 40/22* (2014.01)

(52) U.S. Cl.
CPC .............. *H02S 40/22* (2014.12); *B05D 3/002* (2013.01); *B05D 3/007* (2013.01); *Y02E 10/52* (2013.01)

(58) Field of Classification Search
CPC . C09K 2019/521; Y10T 428/10; B05D 3/007; B05D 3/002; H02S 40/22; Y02E 10/52
See application file for complete search history.

(56) References Cited

U.S. PATENT DOCUMENTS

2009/0325453 A1* 12/2009 Lee .................. C09K 19/36
445/58
2015/0275091 A1* 10/2015 Hatanaka ................ C08L 33/04
525/172

FOREIGN PATENT DOCUMENTS

WO WO-2013191251 A1 * 12/2013 .............. C08L 33/04

OTHER PUBLICATIONS

Xie, Extraordinary Optical Reflection from Annular Dielectric Nanorod Arrays, Jan. 2015, The Open Optics Journal, 9, p. 1-6 (Year: 2015).*

* cited by examiner

*Primary Examiner* — Dah-Wei D. Yuan
*Assistant Examiner* — Nga Leung V Law
(74) *Attorney, Agent, or Firm* — Michael R. Shevlin

(57) ABSTRACT

Disclosed is a method for construction or fabrication of a surface on a substrate, said surface capable of displaying a viewable static image comprising depositing curable polar optical materials in a controlled manner forming a multiplicity of nano-structure arrays, each array having the properties of specific individual reflectance of a narrow wavelength band and high transmissivity of wavelengths outside the reflective band, the dimensions and arrangements of the arrays purposefully chosen to produce predetermined intensities and hues of colors, said arrangements resulting in said viewable static image on said substrate.

8 Claims, 14 Drawing Sheets

IMAGE PRODUCING NANOSTRUCTURE SURFACE

CROSS-REFERENCE TO RELATED APPLICATIONS

This application claims the benefit of U.S. Provisional Application No. 62/230,774, filed Jun. 15, 2015, which is incorporated herein by reference.

BACKGROUND

A limitation in the current state of the art of solar panels is that they are often considered to stand out as unattractive and degrading to the architecture or landscaping that they are installed on or near. For example, an authentic Mexican tile roof on a hacienda in California or Arizona is distractingly marred by the presence of solar panels mounted there. Likewise, the look of a historical building, which would benefit from the green energy of solar panels, would be ruined by the presence of solar panels. In some cases, legal action has been taken to prevent the construction of arrays in certain areas, solely because of how they look. If solar panels could be made to have a more pleasing appearance, or to blend in better with their surroundings, their use would be greatly expanded. However, the panels rely on a broad spectrum of wavelengths for efficiency, necessitating that they be maximally exposed to sunlight, which limits any decorative methods to those that are able to minimize interference with the amount of convertible energy reaching the cells.

Advances in the field of optics motivated by a need to push beyond diffraction limits have led to experimental nano-based technologies pertaining to extraordinary optical transmission and reflection. The reflective properties of annular nanorod arrays have been demonstrated by Xie, Chen, Li and others. The targeted applications of this research have so far been in the areas of sub-diffraction limits in microscopy and imaging.

Applying these phenomena to solar panels, engineered reflective optical elements exhibiting extremely narrow wavelength bands of reflectivity would thus enable the generation of visible color images on the surfaces of solar panels while minimizing the loss of light converted by the panels. In this application, a single element reflects a single color, while groups of elements are combined to create a wide range of colors. Three elements with three corresponding center wavelengths, for example 660 nm (red), 565 nm (green) and 480 nm (blue), can be combined by controlling the percentage of reflectivity of each band to produce a gamut of colors. Unlike pigments, however, which reflect their 'color' while absorbing the other color wavelengths, the elements created by the method of the present invention reflect at the predetermined wavelength, while allowing wavelengths outside the reflective band to pass through the surface with little or no attenuation.

In the current art, the methods of creating nano-hole and nano-structure arrays is complex and time consuming, and the fabrication cost of such arrays is several orders of magnitude higher than would be commercially viable for a widely marketable product.

In view of this, it would be desirable to develop a method or methods of constructing or fabricating low cost nano-hole and nano-structure arrays.

SUMMARY

The present invention is a unique and innovative solution to the aforementioned problems.

In one aspect, the invention is a method of fabricating an image-producing surface by controllably depositing and selectively curing curable polar optical materials on a planar X-Y substrate in the presence of a polarizing field. While said polarizing field is applied in an X direction, a predetermined array of cross-sectional areas of the material are cured through the z-plane of the material. In one embodiment, the cross section of a discrete element of the array is an annular ring. A sub array ("nano-pixel") is an area of a multiplicity of these elements of size and spacing selected to function as a reflective filter with a specific center wavelength. Other sub arrays are areas of multiplicities of these elements of different sizes and spacings, selected to function as reflective filters of other desired center wavelengths. Further, the sub arrays are purposefully arranged into larger arrays ("pixels") so that when viewed by the eye, the wavelengths combine to produce colors with intensities and hues controlled by the combined center wavelengths and the arrangement of the sub arrays. Thus the overall surface can be seen to be made up of arrays of sub arrays which reflect different colors and intensities of light, said arrays functioning in a similar way as pixels on a display screen, forming a color image on the overall surface.

In one embodiment, the selective curing technique is through micro photolithography and specific wavelength energy exposure.

In one embodiment, the selective curing means is through focused electron beam scanning.

In one embodiment, the X polarizing field is removed and a polarizing field is then applied in a Y-direction and the uncured remaining material is cured using conventional means. In one embodiment, the remaining material is cured without a polarizing field present. Thus the three-dimensional nano-structures are created, having been cured in the presence of a polarizing field, and having different properties than those of the material surrounding them, which has been cured in the presence of a polarizing field of a different orientation, or cured without the presence of a polarizing field. The cured planar surface now exhibits the color image as predetermined by the choice of the cross-sections, sizes and spacings of the elements of the sub arrays and the arrangement of the arrays.

In one embodiment, the substrate of the cured planar surface is the glass covering of a solar panel. The solar panel thus exhibits the predetermined color image as previously described.

DETAILED DESCRIPTION

Embodiments of the invention will now be described with reference to the figures, wherein like numerals reflect like elements throughout. The terminology used in the description presented herein is not intended to be interpreted in any limited or restrictive way, simply because it is being utilized in conjunction with detailed descriptions of certain specific embodiments of the invention. Furthermore, embodiments of the invention may include several novel features, no single one of which is solely responsible for its desirable attributes or which is essential to practicing the invention described herein.

Figure 1:
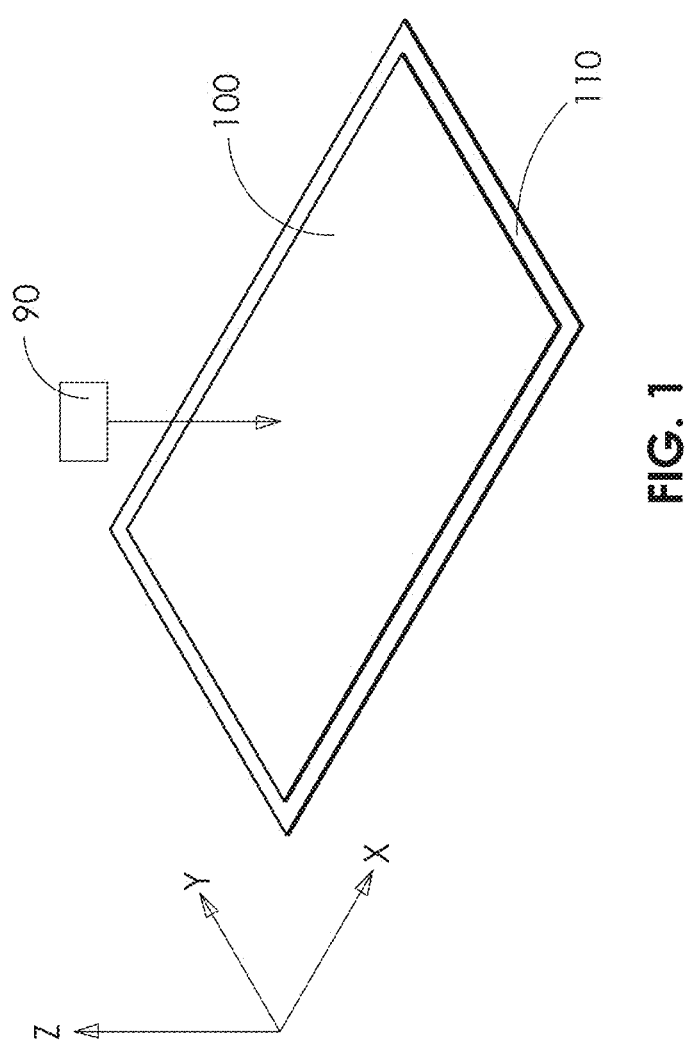
FIG. 1 is a perspective view showing the dispensing of a thin layer of curable polar liquid upon a planar substrate.
Figure 2:
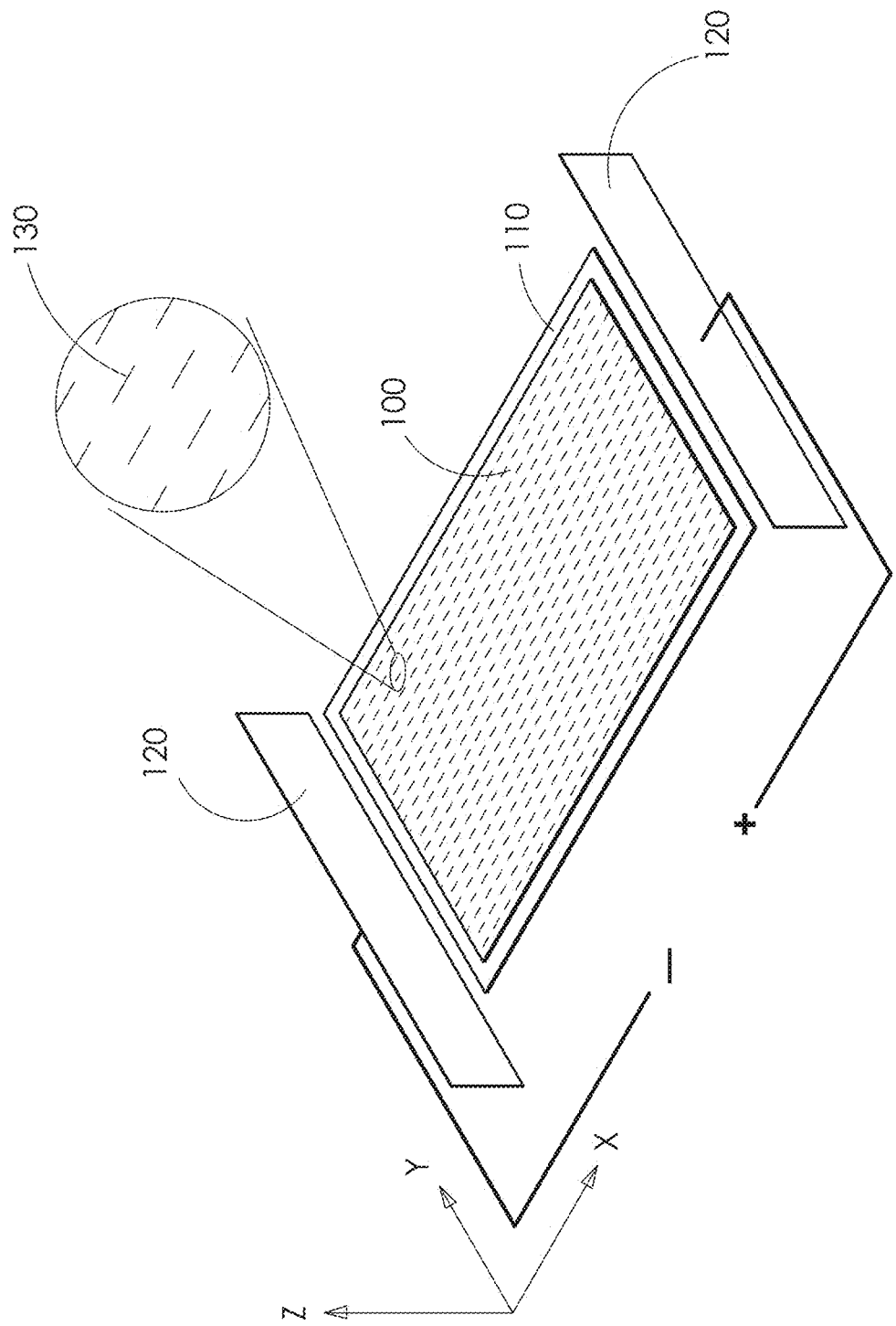
FIG. 2 is a perspective view showing the application of a polarizing field applied in the X direction to a thin layer of curable polar liquid on a planar substrate.

FIGS. 1 through 13 show one embodiment of fabricating the image-producing surface. In FIG. 1, a dispensing head (90) dispenses a thin layer of curable, polar liquid (100) upon a planar X-Y substrate (110). A polarizing field (120) is applied in the X direction (FIG. 2), affecting the orientation of the material on the molecular level (130).

Figure 3:
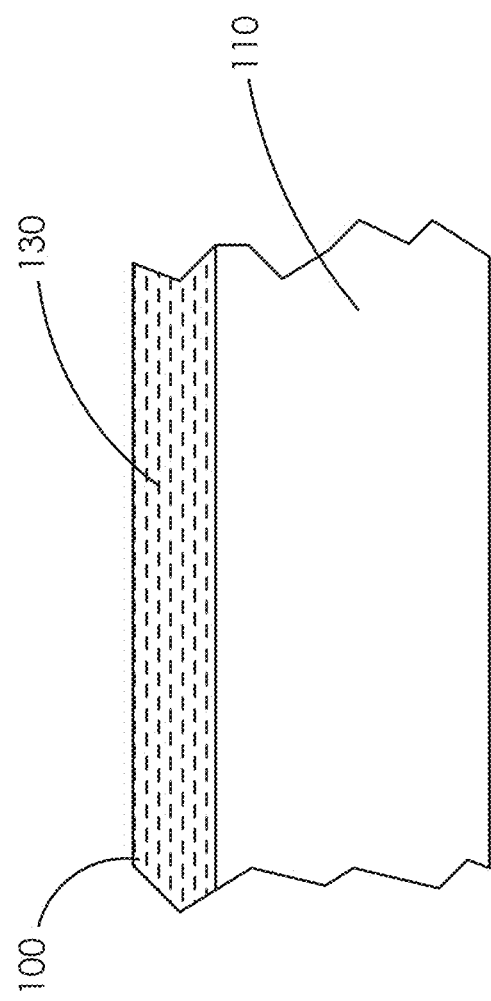
FIG. 3 is a magnified sectional view of an arbitrary area of the layer of curable polar liquid on the substrate of FIG. 2, depicting the polarizing field affecting the orientation of the molecules of the material.
Figure 4:
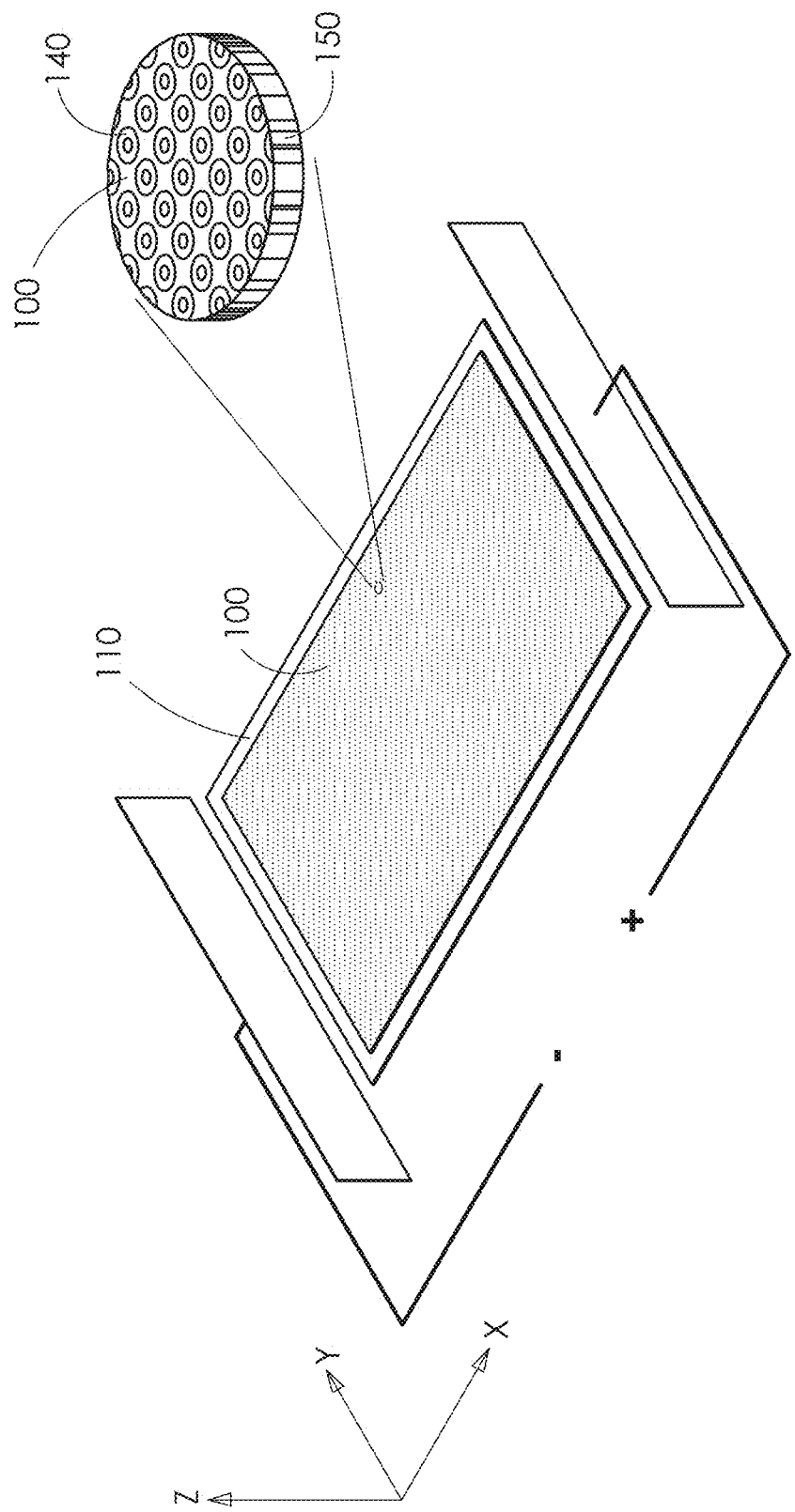
FIG. 4 is a perspective view showing a pattern of discrete nano-structure cross sections.

FIG. 3 is a magnified sectional view of an arbitrary area of the planar surface (110), depicting the effect of the polarizing field on the orientation of the material on a molecular level (130);

In FIG. 4, a pattern of discrete two-dimensional nanostructure cross sections (140), in this embodiment annular rings, is applied to the surface of the layer, curing those areas through the thickness of the layer (150) (Z-axis) by known means, such as through a focused electron-beam scan or photolithography and specific-wavelength energy exposure. This results in the molecules of the patterned structures being "locked" into their polarization orientation. In this embodiment, the resulting nano-structures created by the annular ring cross sections are annular nanorods.

Figure 5:
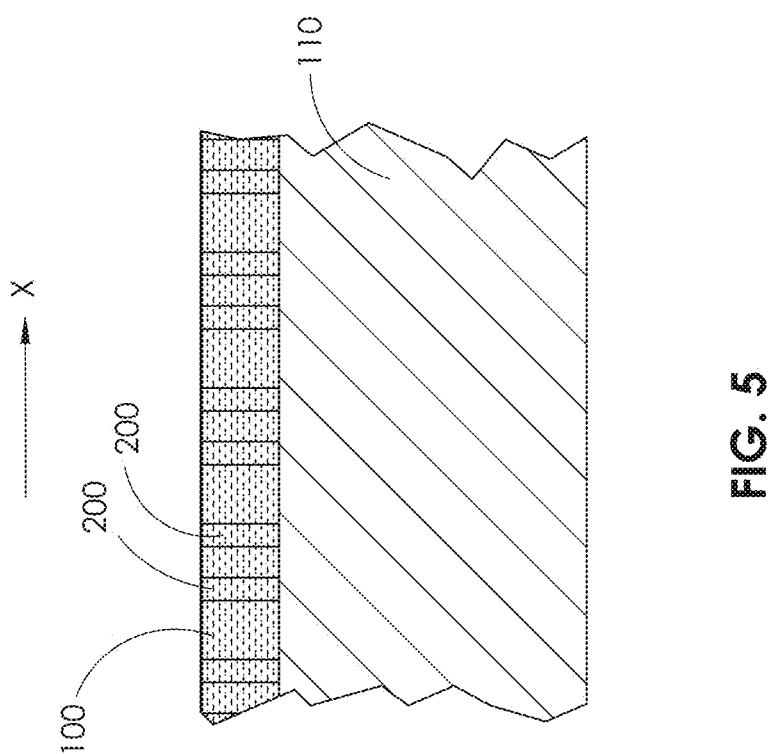
FIG. 5 shows a magnified sectional view of cured nano-structure elements locked into the polarization X-direction within the uncured surrounding material having polarization orientation due to the polarizing field.

FIG. 5 shows a magnified sectional view of cured nanostructure elements (200) within the uncured surrounding material (100), atop the planar substrate (110).

Figure 6:
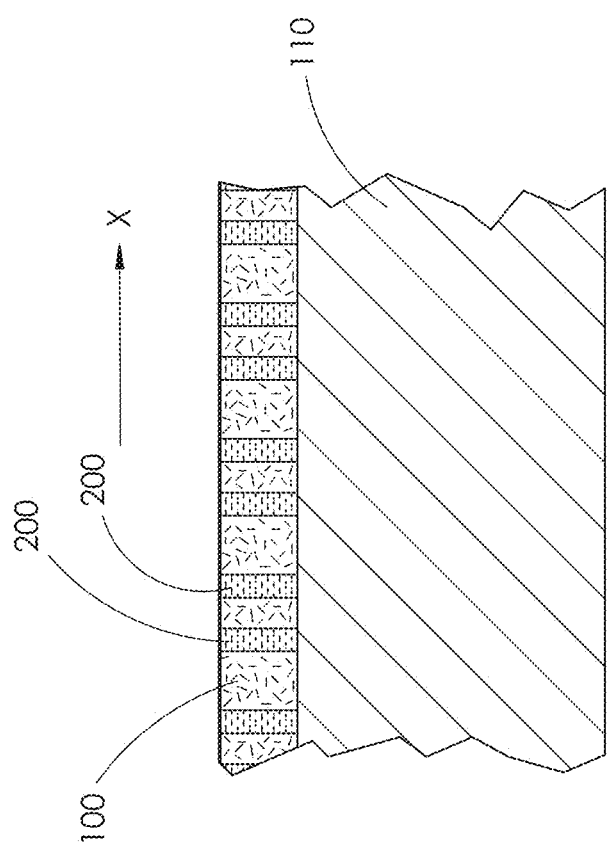
FIG. 6 shows a magnified sectional view of cured nano-structure elements locked into the polarization X-direction within the uncured surrounding material having random orientation without the polarizing field.
Figure 7:
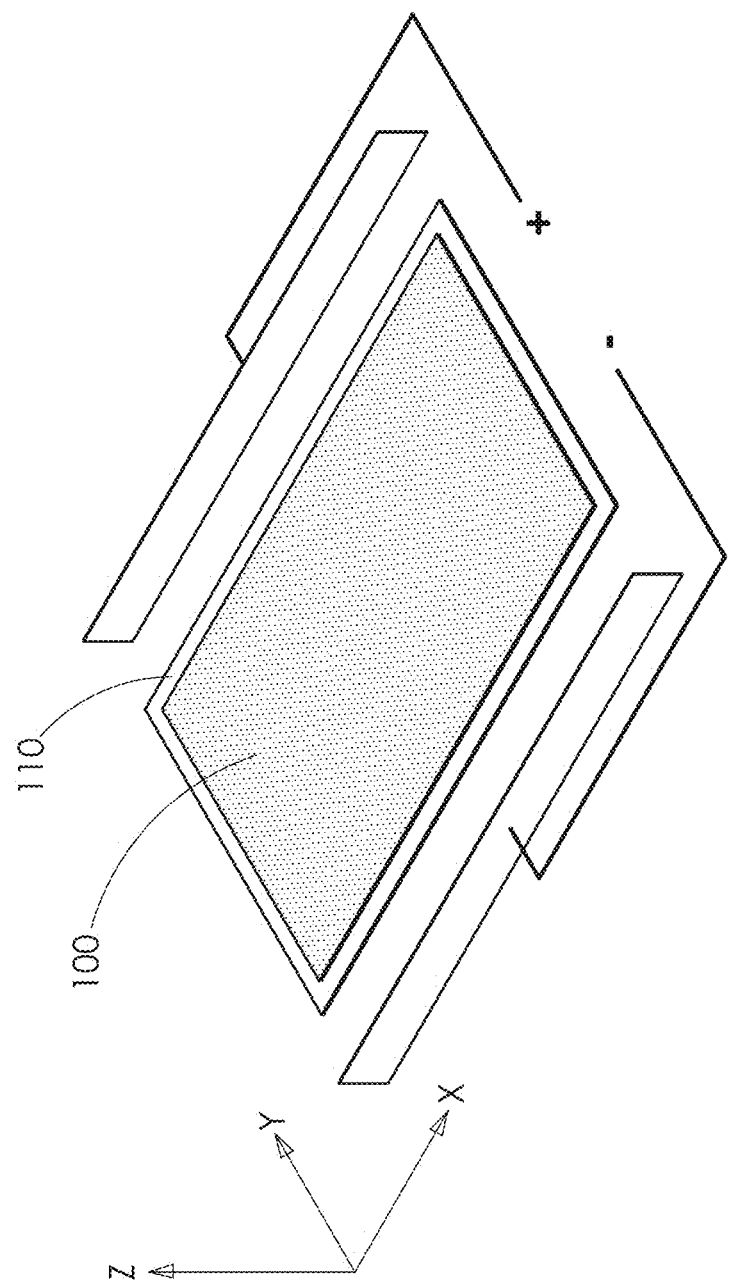
FIG. 7 is a perspective view showing the application of a polarizing field reapplied in the Y direction to the planar substrate of FIG. 2.
Figure 8:
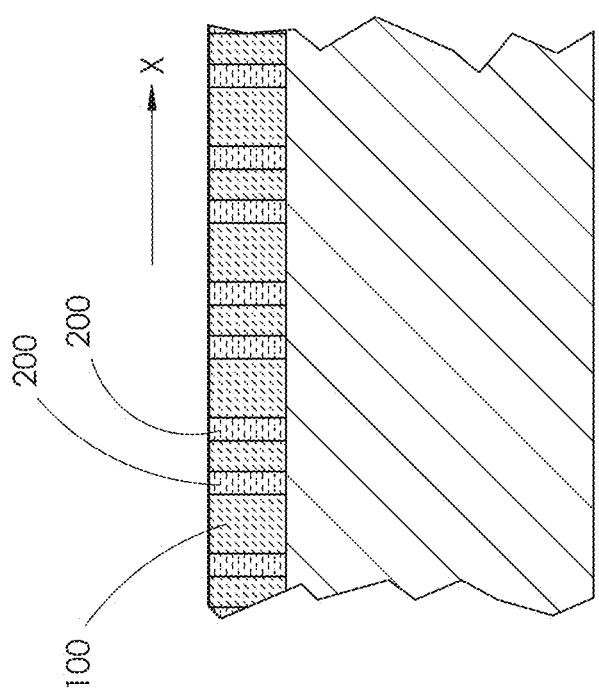
FIG. 8 shows a magnified cross sectional view of cured nanostructure elements locked into the polarization X-direction within the surrounding material having polarization orientation in the Y-direction.

The polarizing field is then removed. FIG. 6 shows a magnified sectional view of the cured elements (200) surrounded by the uncured material, depicting the molecules of cured material locked into the polarization direction, while the molecules of the uncured material (100) exhibit random orientation. The polarizing field is reapplied in the Y direction (FIG. 7). FIG. 8 shows a magnified cross section of the layer with the field applied in the Y-direction, depicting the different alignment of the molecules of the uncured surrounding material (100). The entire layer of remaining uncured material is then cured. This "locks" the molecules of the material surrounding the previously created nanostructures into a different polarization orientation than the nanostructures themselves, thereby resulting in an array of nano-structures with one polarization orientation, and thus the physical properties dictated by that polarization, embedded in a plane of material having a different polarization orientation, and thus the different physical properties dictated by that different polarization.

Figure 9:
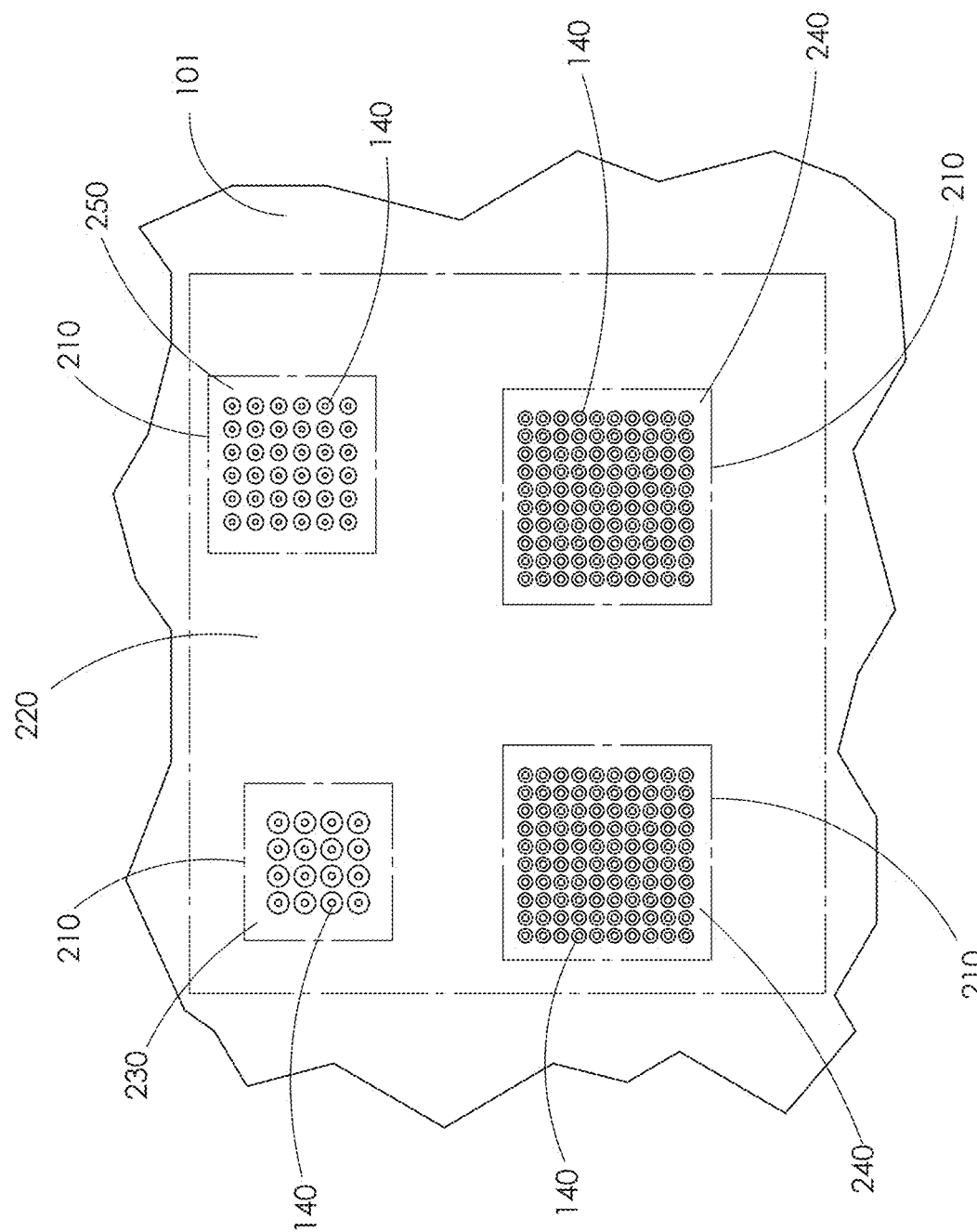
FIG. 9 is a top view of a pixel with four nano-pixels of three different wavelengths with an arbitrary number of nanostructures shown.
Figure 10:
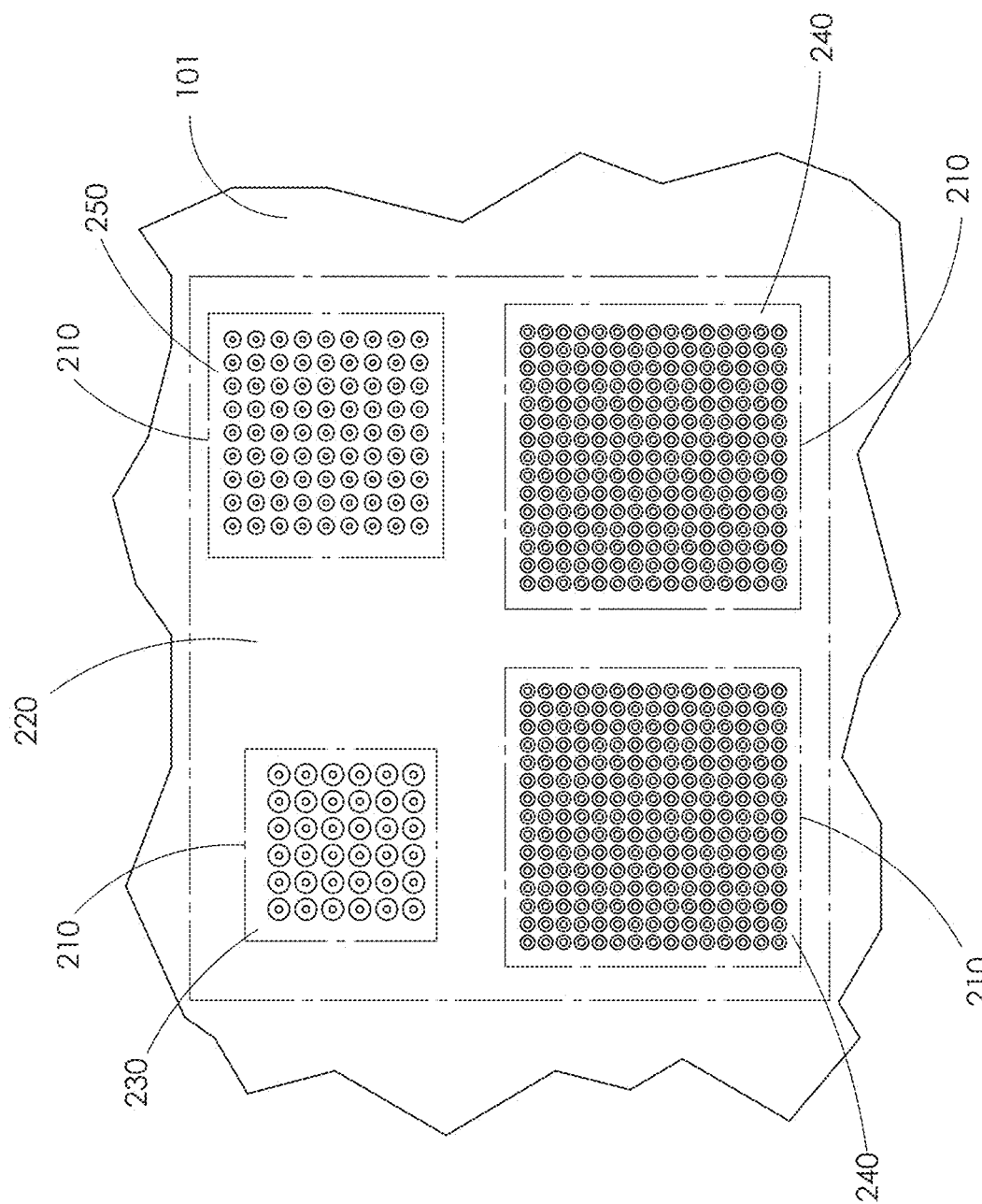
FIG. 10 is a top view of a pixel with four larger nano-pixels.
Figure 11:
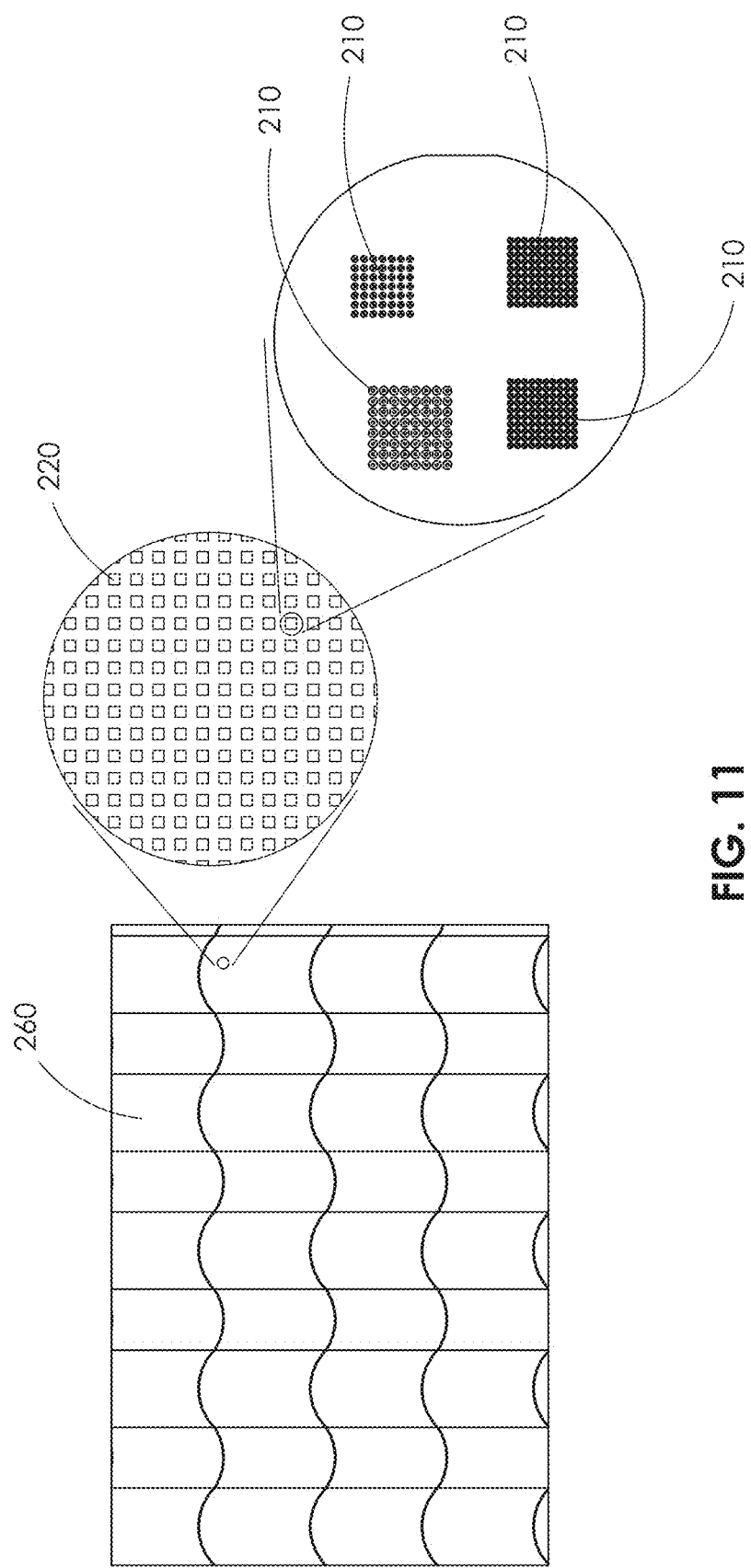
FIG. 11 is a top view of the planar surface with an image of rooftop tiles created by the method of the invention.

The size, spacing, and cross-sectional shapes of the created nanostructures are predetermined according to the desired reflectance wavelengths. A discrete area of nano-structures all having the same size, shape and spacing creates an effective "nano-pixel" which reflects the color of the chosen wavelength. FIG. 9 is a magnified top view of an arbitrary area of the planar layer showing a group of nano-pixels (210), each shown with an arbitrary number of nano-structures (140). Groups of nano-pixels of different wavelengths define a "pixel" (220). The relative intensity of any one color is controlled by the size of that wavelength of nano-pixel within the larger pixel. If, for example, three center wavelengths are chosen for nano-pixels as shown in FIGS. 9 and 10, one at 660 nm (red) (230), two at 565 nm (green) (240) and one at 470 nm (blue) (250), then the intensities of each of those three colors can thus be controlled so that the net color of the pixel when viewed by eye can be made to appear to be a color of any intensity and hue within the RGB gamut. A small nano-pixel results in relatively less intensity of that color. Conversely, a large nano-pixel results in relatively higher intensity of that color. The pixel (220) shown in FIG. 9 has a small red nano-pixel (230), a larger blue nano-pixel (250) and two larger green nano-pixels (240). This example pixel would have a hue of blue-green when viewed by the eye, and be of moderate relative overall intensity. FIG. 10 shows a pixel with the same proportions of the three colors as FIG. 9, but with larger nano-pixels, thus this sample pixel would have the same hue as the pixel of FIG. 9, but would be of higher overall intensity (brighter) to the eye.

Figure 13:
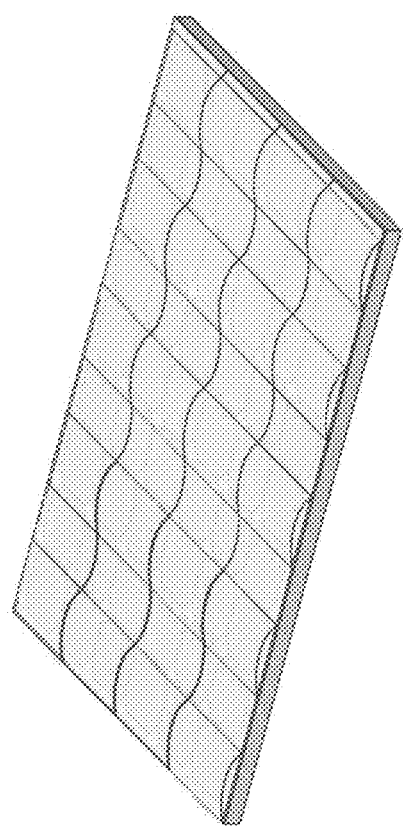
FIG. 13 is a perspective view of an imaged surface applied to a solar panel.
Figure 12:
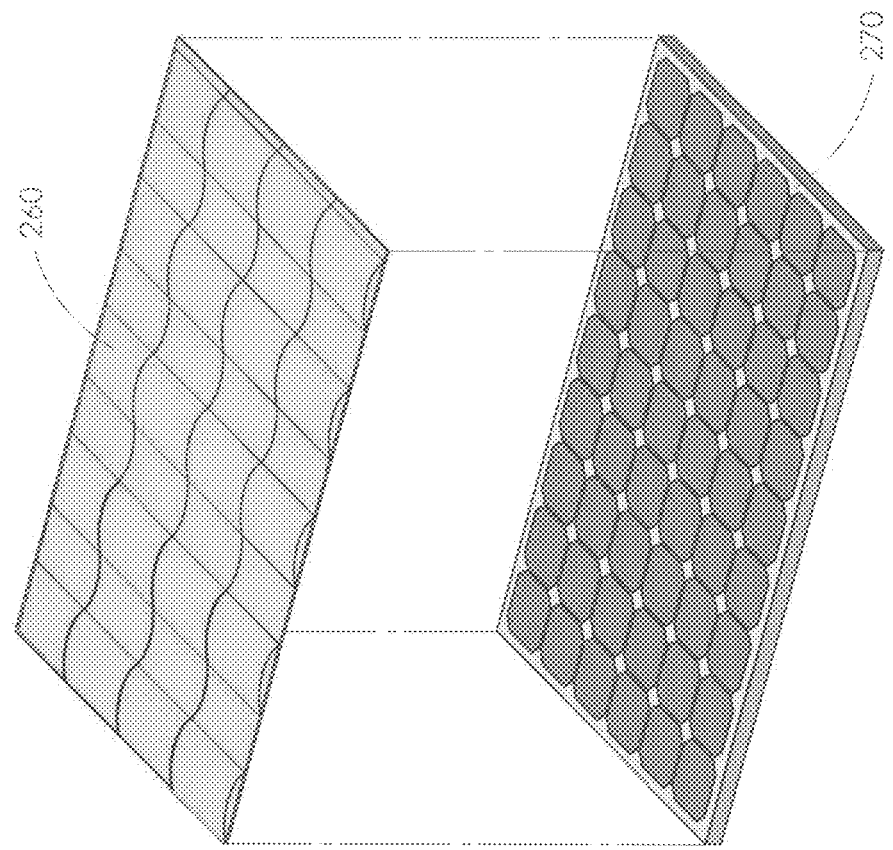
FIG. 12 is a perspective view of an imaged surface in position for application to a solar panel.
Figure 14:
FIG. 14 is a color photograph of a solar panel installation on a residential rooftop.
Figure 15:
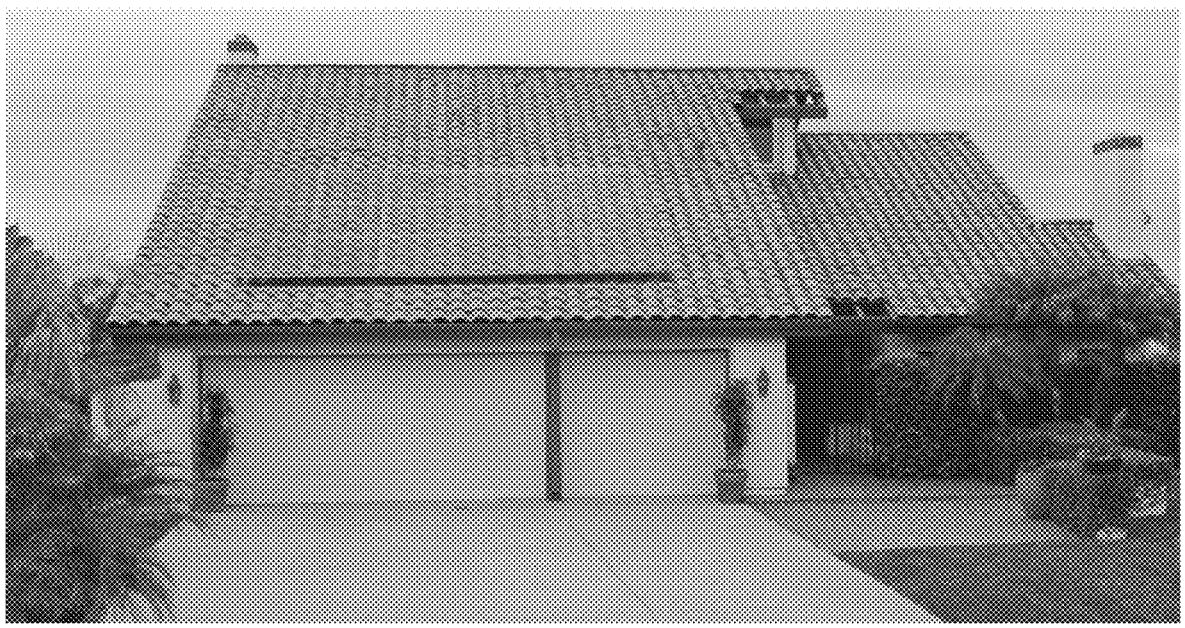
FIG. 15 shows a solar panel with a substrate having an image created by the method of the invention on a residential rooftop.

The overall array of nano-pixels can thus create a visible image in an analogous way as an LCD television screen creates an image (FIG. 11), except that the image of the method of the present invention is created by reflected light rather than transmitted light. The substrate now exhibiting the visible image as described (260), in this case the image of a panel of roof tiles, replaces or covers the clear glass covering of a solar panel. The image is made up of pixels (220), which in turn are made up of groups of nano-pixels (210), chosen to produce the desired image. FIG. 12 shows the imaging panel (260) in position to be applied to a solar panel (270). FIG. 13 shows the imaging panel affixed to the solar panel. FIG. 14 shows an installation of typical solar panels on a residential clay tile roof. FIG. 15 illustrates the same roof with solar panels that have images created by the method of the invention. The image is chosen to emulate the appearance of the tiles from the perspective of the viewer.

Some images that might be chosen to overlay a solar panel or multiple panels include:

An image of roof tiles or shingles;
An image of a grass lawn;
An image of paving stones;
An advertising message;
An image of a field of flowers;
A solid color.

Figure 16:
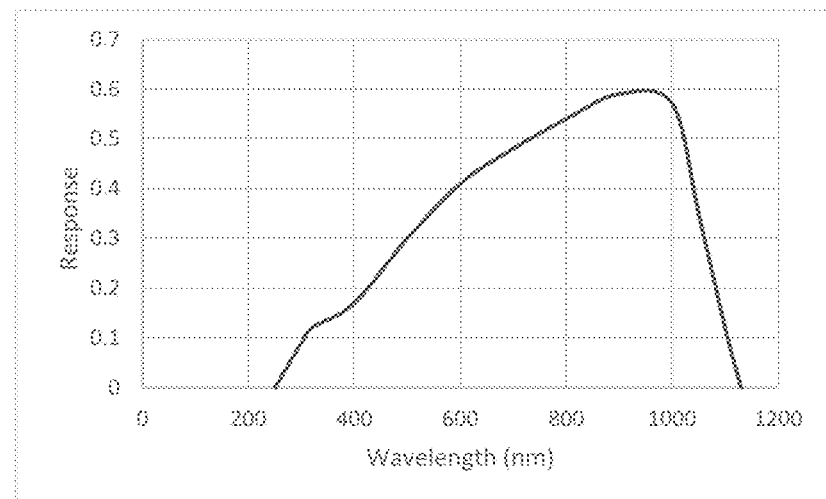
FIG. 16 shows the relative response versus wavelength for a typical silicon solar cell array.
Figure 17:
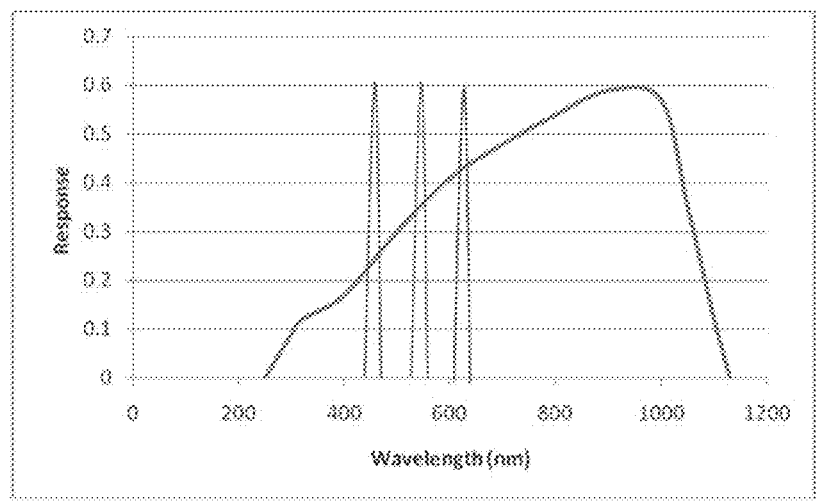
FIG. 17 shows the effect of nano-pixel reflectance bands at typical red, green and blue wavelengths, at 100% intensities, superimposed on the solar cell response of FIG. 16
Figure 18:
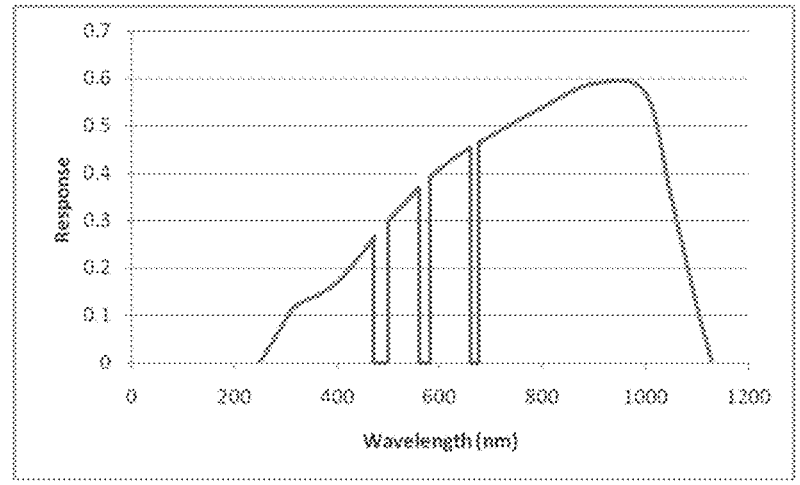
FIG. 18 shows the relative loss of energy available to the solar cell due to the reflectance of the nano-pixels.

By limiting the width of the wavelength band or bands, the loss of convertible energy is kept to a minimum. FIG. 16 shows the relative response versus wavelength for a typical silicon solar cell array. FIG. 17 shows the effect of nano-pixel reflectance bands at typical red, green and blue wavelengths, at 100% intensities, superimposed on the solar cell response of FIG. 16. FIG. 18 shows the relative loss of energy available to the solar cell due to the reflectance of the nano-pixels. In this example, the pixel formed by three nano-pixels would appear as whitish to the eye of the viewer, and represents a worst-case loss of energy. Colors other than white and at lower intensities will result in less loss of energy. On average, the loss can be as little as a few percent of the total energy available to the solar cells. This loss is far outweighed by the overall increase in use of solar panels that would result from making them more aesthetically attractive.

It is clear that the method of the invention can be used to create color images on other surfaces, such as on solar water hearing arrays or other applications where the reflective/transmissive properties of images created by the method of the invention are advantageous. In addition, wavelengths to be reflected can be chosen that are beyond the human visible spectrum for applications in which it is desired to reflect those wavelengths while allowing other wavelengths, such as visible wavelengths, to pass with minimal attenuation.

Thus the limitations and shortcomings of the methods of producing the devices in the current art are overcome in the current invention, which provides significant novel improvements, including improvements in range of applications, versatility, manufacturability and cost-effectiveness.

It is intended that the specification and examples be considered as exemplary only, with a true scope and spirit of the invention being indicated by the following claims. In addition, where this application has listed the steps of a method or procedure in a specific order, it may be possible, or even expedient in certain circumstances, to change the order in which some steps are performed, and it is intended that the particular steps of the method or procedure claims set forth here below not be construed as being order-specific unless such order specificity is expressly stated in the claim.

The invention claimed is:

1. A method of creating an image producing surface for covering a solar panel having arrays of nanostructures to produce a static reflective color image of the solar panel on the image producing surface using reflected light comprising:

dispensing an X-Y planar layer of curable, polar material upon a substrate of the image producing surface on the solar panel;
applying a polarizing field to said planar layer in the X direction;
selectively curing a pattern of discrete cross-sectional areas of the planar layer through the thickness of the planar layer; said pattern made up of arrays of nanostructures specifically chosen to reflect particular wavelengths of light while allowing wavelengths outside the reflective band to pass through the planar layer with no attenuation, and said arrays arranged to create a static reflective color image using the reflected light;
removing said X direction polarizing field;
applying a polarizing field to the planar layer in the XY plane in a non-X direction;
curing the remaining uncured area of said planar layer; and
removing said non-X direction polarizing field.

2. The method of claim 1, wherein the curable, polar material is electrically polar.

3. The method of claim 1, wherein the polarizing field is a static field.

4. A method of fabricating an image producing surface for covering a solar panel having reflective nanostructures generating a reflective color image of the solar panel on the image producing surface using reflected light, comprising:

dispensing an X-Y planar layer of curable, polar material upon a substrate of the image producing surface on the solar panel;
applying one or more X-Y planar polarizing fields to said planar layer;
selectively curing a pattern of nanostructures on the planer layer of polar material specifically chosen to reflect selective wavelengths of light while allowing the remaining wavelengths outside the reflective band to pass through the planar layer with no attenuation to create the reflective color image.

5. The method of claim 4, wherein selectively curing comprises selectively curing a pattern of discrete cross-sectional areas of the layer through the thickness of the layer; said pattern made up of groups of nanostructures arranged to create a particular visible color image.

6. The method of claim 4, wherein applying one or more X-Y planar polarizing fields to said planar layer comprises:

applying the one or more X-Y planar polarizing field to said planar layer in the X direction;
curing the pattern of nanostructures of said planar layer;
removing said X direction polarizing field;
applying a polarizing field in a non-X direction;
curing the remaining uncured area of said planar layer; and
removing said non-X direction polarizing field.

7. The method of claim 4, wherein the curable, polar material is electrically polar.

8. The method of claim 4, wherein the polarizing field is a static field.

* * * * *